(12) United States Patent
Park et al.

(10) Patent No.: US 12,336,223 B2
(45) Date of Patent: *Jun. 17, 2025

(54) THIN FILM TRANSISTOR AND DISPLAY DEVICE INCLUDING THE SAME

(71) Applicant: Samsung Display Co., Ltd., Yongin-si (KR)

(72) Inventors: Joonseok Park, Yongin-si (KR); Jihun Lim, Yongin-si (KR); Myounghwa Kim, Yongin-si (KR); Taesang Kim, Yongin-si (KR); Yeonkeon Moon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 75 days.

This patent is subject to a terminal disclaimer.

(21) Appl. No.: 17/722,611

(22) Filed: Apr. 18, 2022

(65) Prior Publication Data

US 2022/0238720 A1 Jul. 28, 2022

Related U.S. Application Data

(63) Continuation of application No. 16/819,496, filed on Mar. 16, 2020, now Pat. No. 11,309,429, which is a (Continued)

(30) Foreign Application Priority Data

Sep. 1, 2017 (KR) .................. 10-2017-0111930

(51) Int. Cl.
*H10D 30/67* (2025.01)
*H01L 23/532* (2006.01)
(Continued)

(52) U.S. Cl.
CPC ..... *H10D 30/6755* (2025.01); *H01L 23/5329* (2013.01); *H10D 30/6729* (2025.01);
(Continued)

(58) Field of Classification Search
CPC ............. H01L 29/7869; H01L 29/0847; H01L 29/1033; H01L 29/41733; H01L 29/42384;
(Continued)

(56) References Cited

U.S. PATENT DOCUMENTS 6,452,241 B1 * 9/2002 Fukata .............. H01L 29/42384
257/350
6,717,216 B1 * 4/2004 Doris .................. H01L 29/7842
438/149

(Continued)

FOREIGN PATENT DOCUMENTS

CN 101924140 12/2010
CN 106328689 1/2017
(Continued)

OTHER PUBLICATIONS

Chinese Office Action for Application No. CN 201810994061.2, dated Feb. 1, 2023.
(Continued)

*Primary Examiner* — Dale E Page
*Assistant Examiner* — Quovaunda Jefferson
(74) *Attorney, Agent, or Firm* — KILE PARK REED & HOUTTEMAN PLLC

(57) ABSTRACT

A thin film transistor includes an active layer over a substrate, a gate electrode over the active layer, a gate line connected with the gate electrode, and a gate insulation film between the active layer and the gate electrode. The active layer includes a channel region overlapping the gate electrode, and a drain region and a source region on respective
(Continued)

sides of the channel region. A length of a straight line connecting the drain region and the source region by a shortest distance may be greater than a width of the gate line parallel to the straight line.

22 Claims, 13 Drawing Sheets

Related U.S. Application Data continuation of application No. 16/108,454, filed on Aug. 22, 2018, now Pat. No. 10,593,808.

(51) Int. Cl.
  H10D 62/13 (2025.01)
  H10D 62/17 (2025.01)
  H10D 62/80 (2025.01)
  H10K 59/124 (2023.01)
(52) U.S. Cl.
  CPC ....... H10D 30/673 (2025.01); H10D 30/6757 (2025.01); H10D 62/151 (2025.01); H10D 62/235 (2025.01); H10D 62/80 (2025.01); H10K 59/124 (2023.02)
(58) Field of Classification Search
  CPC ........... H01L 29/78696; H01L 23/5329; H01L 27/3258; H10D 30/6755; H10D 30/6729; H10D 30/673; H10D 30/6757; H10D 30/6704; H10D 30/6713; H10D 62/151; H10D 62/235; H10D 62/80; H10D 86/441; H10D 86/60; H10D 86/40; H10K 59/124; H10K 59/31; H10K 59/1213
  See application file for complete search history.

(56) References Cited

U.S. PATENT DOCUMENTS

| 6,825,134 | B2* | 11/2004 | Law | C23C 16/402 |
| | | | | 257/E21.414 |
| 7,078,298 | B2* | 7/2006 | Lee | H01L 29/78639 |
| | | | | 257/E21.414 |
| 8,053,820 | B2 | 11/2011 | Hashitani | |
| 8,643,008 | B2 | 2/2014 | Yamazaki et al. | |
| 9,117,783 | B2* | 8/2015 | Jin | H10K 50/805 |
| 10,593,808 | B2* | 3/2020 | Park | H10K 59/124 |
| 11,309,429 | B2* | 4/2022 | Park | H01L 29/78696 |
| 2003/0143377 | A1* | 7/2003 | Sano | H01L 29/78645 |
| | | | | 428/156 |
| 2004/0232425 | A1 | 11/2004 | Kawata | |
| 2006/0237789 | A1 | 10/2006 | Ahn et al. | |
| 2007/0029614 | A1* | 2/2007 | Shiota | H01L 27/1288 |
| | | | | 257/E29.293 |
| 2007/0241992 | A1* | 10/2007 | Fukumoto | G09G 3/3275 |
| | | | | 345/55 |
| 2009/0325341 | A1 | 12/2009 | Itagaki et al. | |
| 2010/0044699 | A1* | 2/2010 | Chung | H01L 29/78618 |
| | | | | 257/43 |
| 2011/0260168 | A1 | 10/2011 | Toyota | |
| 2012/0032173 | A1 | 2/2012 | Sato et al. | |
| 2012/0097965 | A1 | 4/2012 | Shin et al. | |
| 2013/0020569 | A1 | 1/2013 | Yamazaki et al. | |
| 2016/0268417 | A1* | 9/2016 | Miyake | H10D 30/6729 |
| 2017/0005152 | A1 | 1/2017 | Hong et al. | |

FOREIGN PATENT DOCUMENTS

| JP | 5-190573 | 7/1993 |
| JP | 2017-85079 | 5/2017 |
| KR | 10-2006-0000847 | 1/2006 |
| KR | 10-2009-0092231 | 8/2009 |
| KR | 10-2013-0012055 | 1/2013 |
| KR | 10-2015-0142205 | 12/2015 |
| KR | 10-2016-0065647 | 6/2016 |

OTHER PUBLICATIONS

Rongsheng Chen et al., "Self-aligned top-gate InGaZnO thin film transistors using SiO2/Al2O3 stack gate dielectric", Thin Solid Films, 2013, pp. 572-575, vol. 548, Elsevier B.V.

* cited by examiner

THIN FILM TRANSISTOR AND DISPLAY DEVICE INCLUDING THE SAME

CROSS-REFERENCE TO RELATED APPLICATION(S)

This is a continuation application of U.S. patent application Ser. No. 16/819,496, filed Mar. 16, 2020. now U.S. Pat. No. 11,309,429 on Apr. 19, 2022; the disclosure of which is incorporated herein by reference in its entirety. U.S. patent application Ser. No. 16/819,496 is a continuation application of U.S. patent application Ser. No. 16/108,454, filed Aug. 22, 2018, now U.S. Pat. No. 10,593,808, issued Mar. 17, 2020, the disclosure of which is incorporated herein by reference in its entirety. U.S. patent application Ser. No. 16/108,454 claims priority benefit of Korean Patent Application No. 10-2017-0111930 under 35 U.S.C. § 119, filed on Sep. 1, 2017, the disclosure of which is incorporated herein by reference in its entirety for all purposes.

BACKGROUND

1. Field

One or more embodiments described herein relate to a thin film transistor and a display device including a thin film transistor.

2. Description of the Related Art

A variety of flat panel displays have been developed. These displays have thin film transistors, capacitors, and other elements. Each of the thin film transistors may include a channel region in an active layer, a source region, a drain region, and a gate electrode electrically insulated from the active layer by a gate insulation layer.

The active layer may include amorphous silicon or poly-silicon. When the active layer includes amorphous silicon, charge mobility is low. Thus, it may be difficult to implement a driving circuit that operates at a high speed. When the active layer includes poly-silicon, charge mobility may be improved but the threshold voltage (Vth) of the thin film transistor may vary. Thus, a separate compensation circuit may be added in an attempt to offset the threshold variation.

SUMMARY

In accordance with one or more embodiments, a thin film transistor includes an active layer over a substrate; a gate electrode over the active layer; a gate line connected with the gate electrode; and a gate insulation film between the active layer and the gate electrode, wherein the active layer includes a channel region overlapping the gate electrode and a drain region and a source region on respective sides of the channel region, and wherein a length of a straight line connecting the drain region and the source region by a shortest distance is greater than a width of the gate line parallel to the straight line.

A length of the gate electrode parallel to the straight line may be greater than a width of the gate line. The gate electrode may include a plurality of trenches toward an inside of the gate electrode from an outer side surface of the gate electrode. The plurality of trenches may penetrate the gate electrode in a thickness direction of the gate electrode. The channel region may include at least one bent portion, and a length of the gate electrode, measured from the drain region to the source region, may be greater than a length of the straight line. The gate electrode may include a plurality of trenches toward an inside of the gate electrode from an outer side surface of the gate electrode.

The thin film transistor may include a first insulation film covering the gate electrode, the gate line, the source region, and the drain region; a source electrode on the first insulation film and electrically connected with the source region; and a drain electrode on the first insulation film and electrically connected with the drain region. The active layer may include an oxide semiconductor. The gate electrode and the gate line may be integrated with each other, and a shortest distance between any one point of the channel region and an outer side surface of the gate electrode may be 7 μm or less.

In accordance with one or more other embodiments, a display device includes a substrate; a thin film transistor on the substrate; and a display element on the substrate and electrically connected with the thin film transistor. The thin film transistor includes: an active layer including a drain region and a source region on respective sides of a channel region; a gate electrode over the active layer and overlapping the channel region; a gate line through which an electrical signal is to be applied to the gate electrode; and a gate insulation film between the active layer and the gate electrode, wherein a length of a straight line connecting one end of the gate insulation film adjacent to the drain region and another end of the gate insulation film adjacent to the source region by a shortest distance is greater than a width of the gate line parallel to the straight line.

A length of the gate insulation film parallel to the straight line may be greater than a width of the gate line. The gate electrode may include a plurality of trenches toward the inside of the gate electrode from an outer side surface of the gate electrode. The plurality of trenches may penetrate the gate electrode in a thickness direction of the gate electrode. The gate insulation film may include at least one bent portion, and a length of the gate insulation film, measured from the drain region to the source region, may be greater than a length of the straight line. The gate electrode may include a plurality of trenches toward an inside of the gate electrode from an outer side surface of the gate electrode.

The thin film transistor may include a first insulation film covering the gate electrode, the gate line, the source region, and the drain region; a source electrode on the first insulation film and electrically connected with the source region; and a drain electrode on the first insulation film and electrically connected with the drain region, wherein the source electrode or the drain electrode is electrically connected with the display element. The active layer may include an oxide semiconductor.

The gate electrode and the gate line may be integrated with each other, and a shortest distance between any one point of the channel region and an outer side surface of the gate electrode may be 7 μm or less. The display device may include a buffer layer between the substrate and thin film transistor; and a conductive layer between the substrate and buffer layer, wherein the conductive layer overlaps the thin film transistor.

The thin film transistor may include a first insulation film covering the gate electrode, the gate line, the source region, and the drain region; a source electrode on the first insulation film and electrically connected with the source region; and a drain electrode on the first insulation film and electrically connected with the drain region, wherein the source electrode is electrically connected with the conductive layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
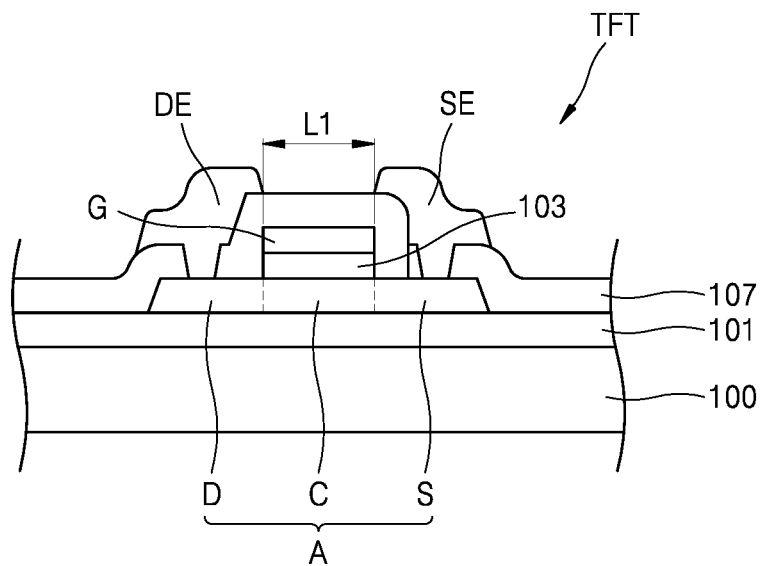
FIG. 1 illustrates an embodiment of a thin film transistor.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates a sectional view of an embodiment of a thin film transistor TFT which may include an active layer A over a substrate 100, a gate electrode G over the active layer A, and a gate insulation film 103 between the active layer A and the gate electrode G. The substrate 100 may include a transparent glass material (e.g., $SiO_2$), ceramic, plastic, stainless steel, or another material.

A buffer layer 101 may be further provided on the substrate 100 in order to impart smoothness to the substrate 100 and prevent the penetration of impurities. The buffer layer 101 may include an inorganic material such as silicon nitride and/or silicon oxide. The buffer layer 101 may include a single layer or a plurality of layers.

The active layer A may include an oxide semiconductor. The active layer A may include, for example, an oxide of indium (In), gallium (Ga), tin (Sn), zirconium (Zr), vanadium (V), hafnium (Hf) cadmium (Cd), germanium (Ge) chromium (Cr), titanium (Ti), and zinc (Zn). In one embodiment, the active layer A may be an ITZO (InSnZnO) semiconductor layer or an IGZO (InGaZnO) semiconductor layer.

The gate insulation film 103 may be on the active layer A. The gate electrode G may be at a position overlapping the active layer A, with the gate insulation film 103 therebetween. The gate insulation film 103 insulates the active layer A from the gate electrode G and may include an organic material or an inorganic material such as SiNx or $SiO_2$.

The gate electrode G may include a single layer or a plurality of layers including, for example, at least one metal of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu). The gate electrode G may be connected with a gate line through which an electrical signal is applied to the gate electrode G.

The active layer A may include a channel region C overlapping the gate electrode G. A source region S and a drain region D may be on respective sides of the channel region G. The source region S and the drain region D may have higher electric conductivity than the channel region C. In one embodiment, the source region S and drain region D may have electrical conductivity greater than the channel region C by conduction using plasma treatment or by impurity doping.

The channel region C may have substantially the same shape as the gate electrode G. For example, the active layer A may be doped with an impurity, while the gate insulation film 103 is formed on the active layer A using the gate electrode G as a self-alignment mask. The channel region C may be formed at a position overlapping the gate electrode G. Each of the source region S and the drain region D may be doped with an impurity and formed on respective lateral sides of the channel region C. Therefore, the channel region C may have a predetermined length L1 depending on the width of the gate electrode G, and characteristics of the thin film transistor TFT may vary depending on the length L1 of the channel region C.

Since the gate insulation film 103 is patterned using the gate electrode G as a mask after doping the active layer A with an impurity, the gate insulation film 103 may also have substantially the same shape as the gate electrode G.

The thin film transistor TFT may further include a source electrode SE, and a drain electrode DE. A first insulation film 107 may cover the gate electrode G, the source region S, and the drain region D. The source electrode SE and the drain electrode DE are on the first insulation film 107. The first insulation film 107 may also cover the gate line and the gate electrode G.

The first insulation film 107 may be formed, for example, with at least one organic insulation material, e.g., polyimide, polyamide, acrylic resin, benzocyclobutene, and phenol resin. The first insulation film 107 may include, for example an inorganic insulation such as $SiO_2$, SiNx, $Al_2O_3$, CuOx, $Tb_4O_7$, $Y_2O_3$, $Nb_2O_5$, and $Pr_2O_3$, and may have a multi-layer structure in which organic insulation materials and inorganic insulation materials alternate.

The source electrode SE is electrically connected to the source region S through the first insulation film 107. The drain electrode DE is electrically connected to the drain region D through the first insulation film 107. Each of the source electrode SE and the drain electrode DE may include a single layer or a plurality of layers including, for example, at least one metal of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu). For example, each of the source electrode SE and the drain electrode DE may have a three-layer laminate structure of a titanium (Ti) layer, an aluminum (Al) layer, and a titanium (Ti) layer.

Figure 2:
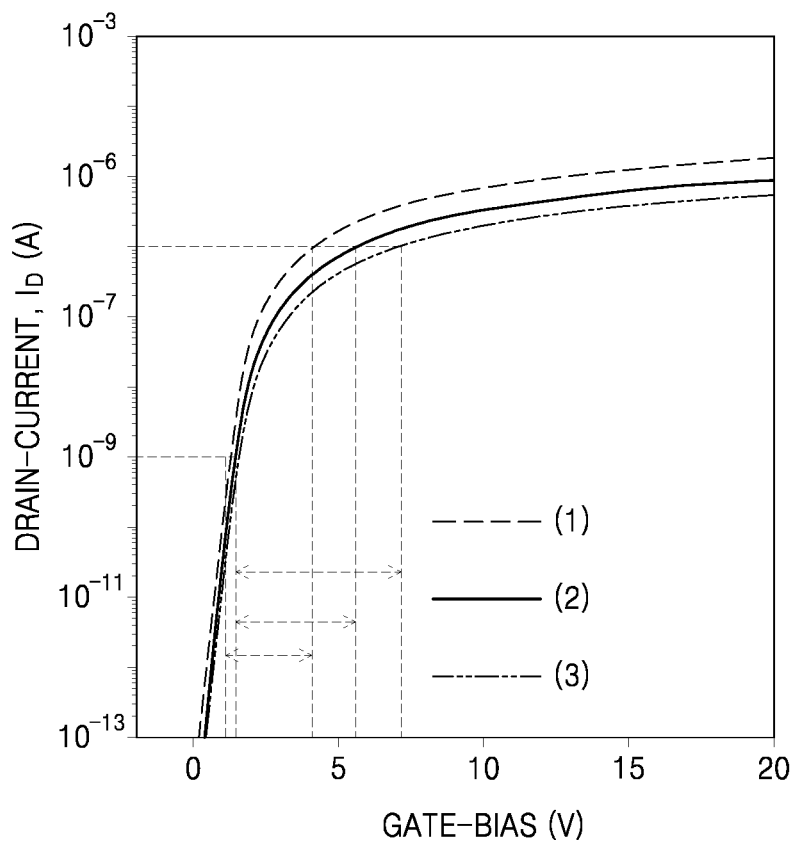
FIG. 2 illustrates examples of the characteristics of thin film transistors having different channel length.
Figure 3:
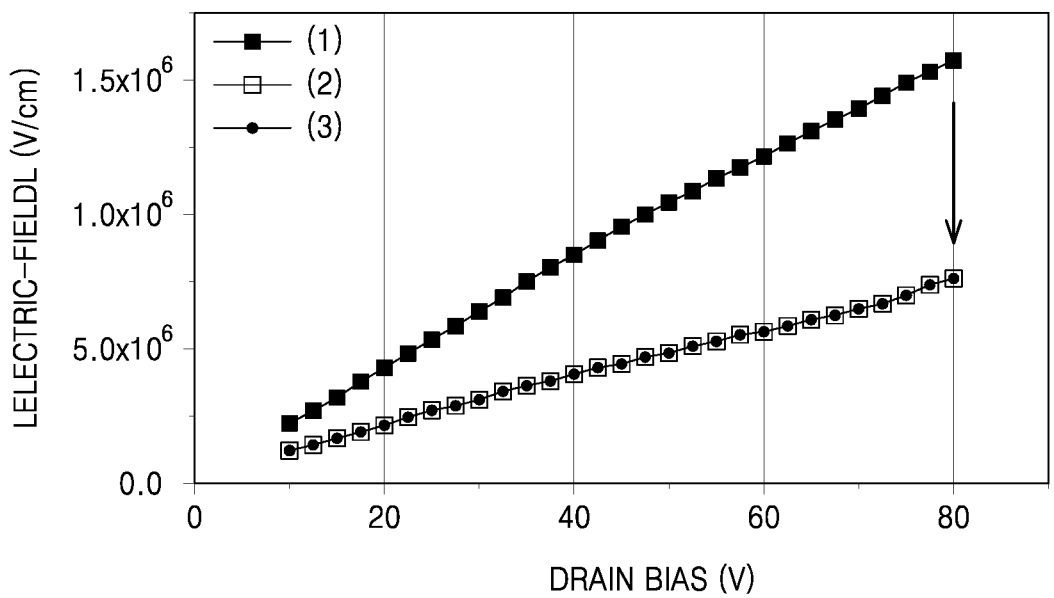
FIG. 3 illustrates examples of electric field measurements for thin film transistors having different channel length.

FIG. 2 is a graph illustrating an example of changes in characteristics of a thin film transistor depending on channel length of the thin film transistor. FIG. 3 is a graph illustrating example results of electric field measurements depending on channel length of the thin film transistor. Details will be described with reference to FIGS. 2 and 3 together with FIG. 1.

In FIGS. 2 and 3, (1) is a case where the channel length L1 is 5 μm, (2) is a case where the channel length L1 is 9.7 μm, and (3) is a case where the channel length L1 is 15.7 μm. The channel length L1 may correspond to the length of the channel region C between the source region S and the drain region D.

In FIG. 2, a transfer curve of the thin film transistor TFT is shown depending on the channel length L1. In case (1), the driving range (v1) of the gate voltage is 2.09 V. In case (3), the driving voltage range (v3) of the gate voltage is 3.85 V. Thus, as the channel length L1 increases, the driving range of a gate voltage applied to the gate electrode G increases. It may therefore be possible to more finely control the gradation of the light emitted from the display element (e.g., OLED of FIG. 12) of the display device by changing the magnitude of the gate voltage.

FIG. 3 shows example results of measuring an electric field depending on the channel length L1. The electric field was measured at the boundary between the channel region C and the drain region D. As shown in FIG. 3, as the channel length L1 increases, the change in $V_{DS}$ per unit length decreases. Thus, the electric field at the boundary between the channel region C and the drain region D decreases. Therefore, even when VDS is large, stress due to the VDS may be reduced. As a result, the reliability of the thin film transistor TFT may be improved.

As such, when the length L1 of the channel region C of the thin film transistor TFT increases, various characteristics of the thin film transistor TFT may be improved. However, when the gate electrode G (which determines the length L1 of the channel region C) and the gate line (which is capable of being integrated with the gate electrode G) are formed to have the same width, then the width of the gate line may increase as the length L1 of the channel region C increases. As a result, the threshold voltage Vth may vary during the repetitive sweeping of the thin film transistor TFT.

Figure 4A:
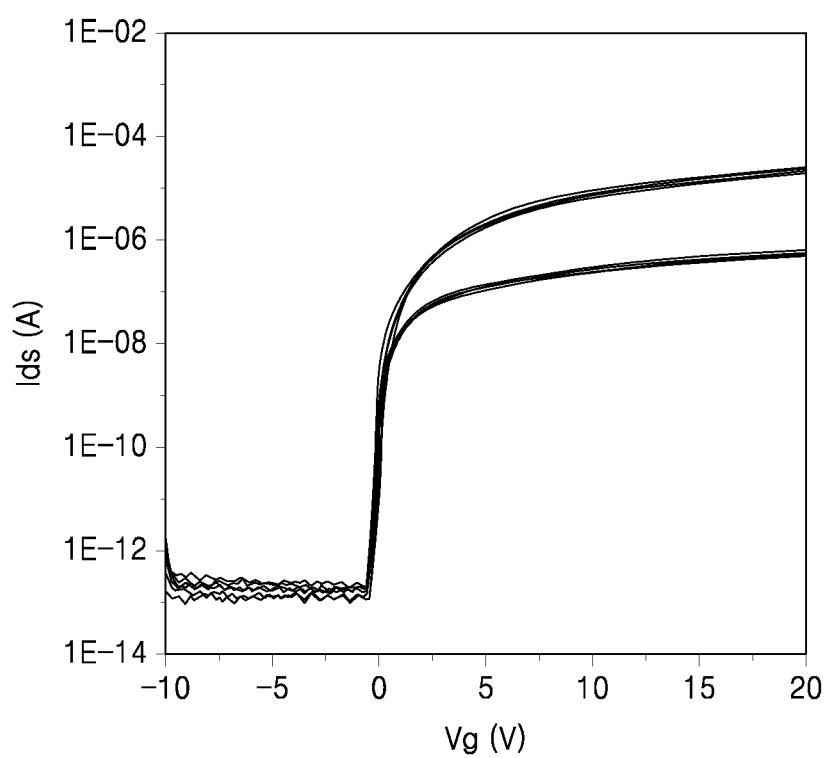
FIGS. 4A to 4C illustrate examples of changes in threshold voltage of thin film transistors.
Figure 4B:
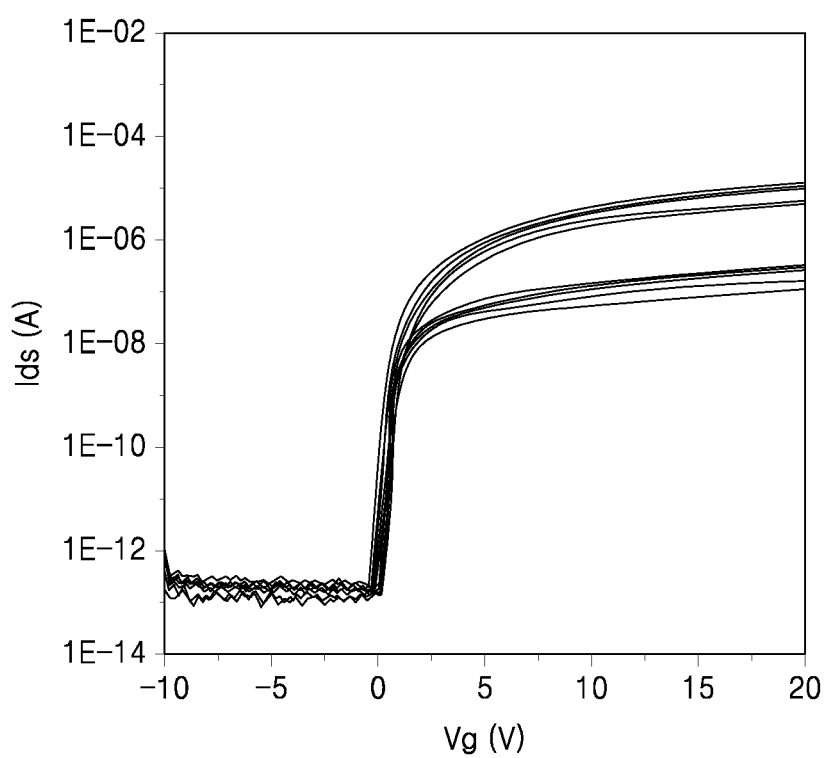
Figure 4C:
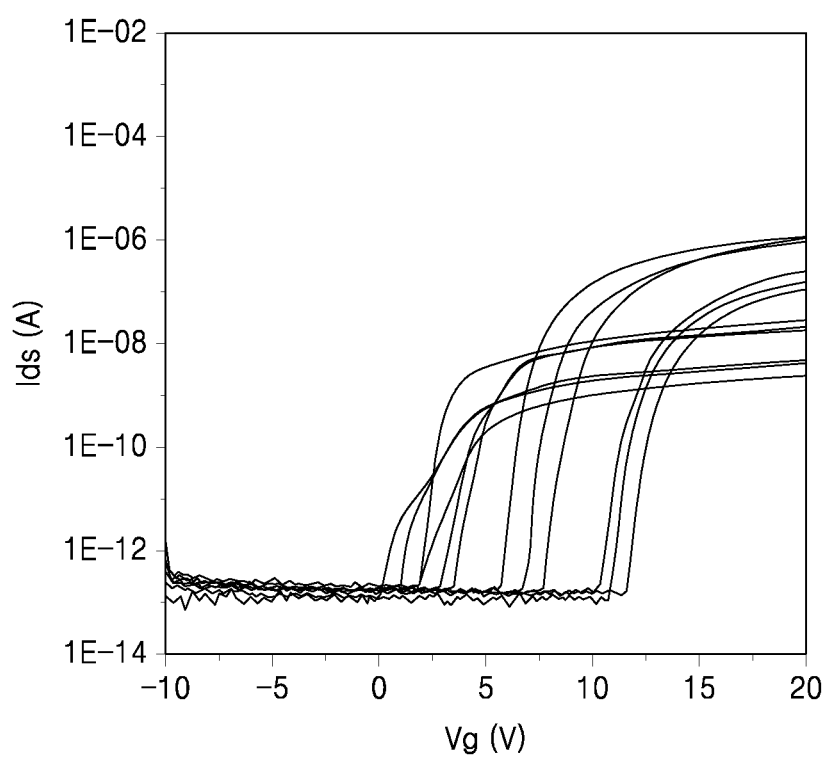
Figure 5:
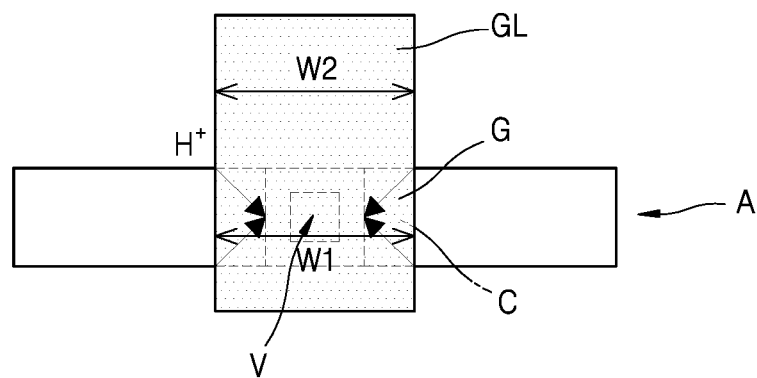
FIG. 5 illustrates example of a thin film transistor for explaining a change in threshold voltage.

FIGS. 4A to 4C are graphs illustrating examples of changes in threshold voltage of the thin film transistor depending on the width of a gate line connected with the gate electrode of the thin film transistor. FIG. 5 is a plan view illustrating an example of a thin film transistor for explaining the change in threshold voltage of the thin film transistor. Details will be described with reference to FIGS. 4A to 4C and FIG. 1.

FIG. 4A shows a case where the channel length L1 is 5 μm, FIG. 4B shows a case where the channel length L1 is 9.7 μm, and FIG. 4C shows a case where the channel length L1 is 15.7 μm. FIGS. 4A to 4C show the results of sweeping the VDS six times from 0.1 V to 5.1 V, respectively. As shown in FIGS. 4A to 4C, it can be seen that as the channel length L1 increases, the threshold voltage Vth of the thin film transistor TFT shifts to the right during the repetitive sweeping. The reason for this may be that, as the channel length L1 increases (e.g., as the width of the gate electrode G increases), electron trapping occurs at the interface between the channel region C and the gate insulation film 103 (e.g., see FIG. 1). One possible cause of the electronic trapping may be described with reference to FIG. 5.

The thin film transistor TFT is subject to a heat treatment process after forming the first insulation film 107. During the heat treatment process, hydrogen in the first insulation film 107 diffuses into the channel region C to prevent trapping of electrons in the channel region C. However, as shown in FIG. 5, when the width W1 of the gate electrode G is equal to the width W2 of the gate line GL, then the width W2 of the gate line GL may increase as the width W1 of the gate electrode G increases. Thus, during the heat treatment process after forming the first insulation film 107, the distance from the intersection of the gate line GL and the active layer A to the center of the channel region C increases. As a result, the diffusion distance of hydrogen increases, so that a region V into which hydrogen does not sufficiently diffuse may be formed in the central region of the channel region C. Therefore, the length of the channel region C may be increased and the hydrogen may be diffused into the entire channel region C during the heat treatment after forming the first insulation film 107.

Figure 6:
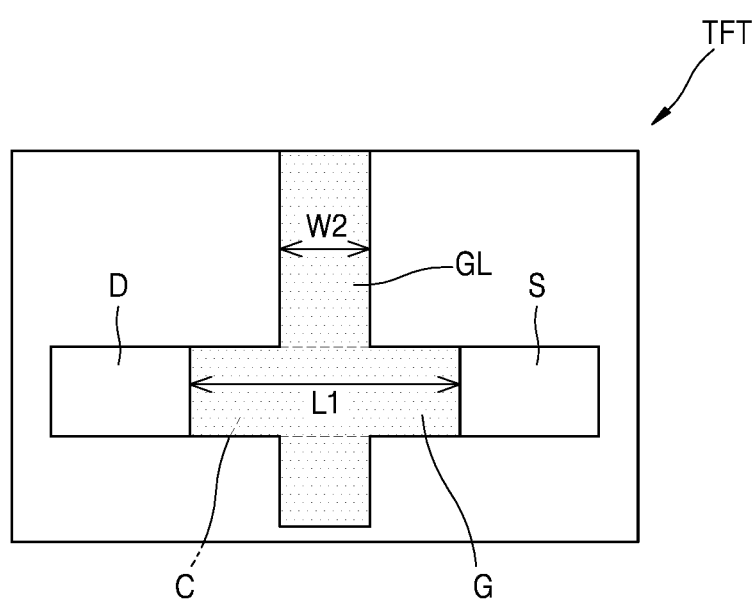
FIG. 6 illustrates an embodiment of a thin film transistor.

FIGS. 6 to 9 are plan views illustrating respective examples of the thin film transistor of FIG. 1. Referring to FIG. 6, the length of a straight line connecting the drain region D and source region S of the thin film transistor TFT by the shortest distance may be greater than the width W2 of the gate line GL. The width W2 of the gate line GL may correspond to the width measured in a direction parallel to the straight line. For example, the gate electrode G may extend toward the source region S and the drain region D in a direction parallel to the straight line. Thus, the length L1 of the channel region C having the same shape as the gate electrode G increases. This may increase the driving range of the gate voltage applied to the gate electrode G of the thin film transistor TFT and improve reliability of the thin film transistor TFT. Further, as described above, since the gate insulation film 103 (e.g., see FIG. 1) may also have substantially the same shape as the gate electrode G, the length of a straight line connecting the one end of the gate insulation film 103 (e.g., see FIG. 1) adjacent to the drain region D and the other end of the gate insulation film 103 (e.g., see FIG. 1) adjacent to the source region S may be greater than the width W2 of the gate line GL.

Since the gate line GL has a smaller width W2 than the gate electrode G, the distance from the intersection of the gate line GL and the active layer A to the center of the channel region C may not increase or may decrease, even when the length L1 of the channel region C increases. Therefore, during the heat treatment after the formation of the first insulation film 107 (e.g., see FIG. 1), hydrogen may be diffused into the entire channel region C, thereby preventing the occurrence of electron trapping at the interface between the channel region C and the gate insulation film 103 (e.g., see FIG. 1). Therefore, the change in the threshold voltage Vth of the thin film transistor TFT may be reduced or minimized, even during repetitive sweeping.

During the heat treatment after the formation of the first insulation film 107 (e.g., see FIG. 1), in order for hydrogen to be more effectively diffused into the entire channel region C, the shortest distance between any one point of the channel region C and the outer side surface of the gate electrode G may be 7 μm or less.

The center of the channel region C is a point that spaced farthest away from the outer side surface of the gate electrode G. If the distance from the intersection of the gate line GL and the channel region C to the center of the channel region C is 7 μm or less, the entire channel region C is spaced from the outer side surface of the gate electrode G by a distance of 7 μm or less. Thus, hydrogen may be effectively diffused into the entire channel region C during the heat treatment after the formation of the first insulation film 107 (e.g., see FIG. 1). The aforementioned range is an example range and different ranges may apply in one or more embodiments.

Figure 7:
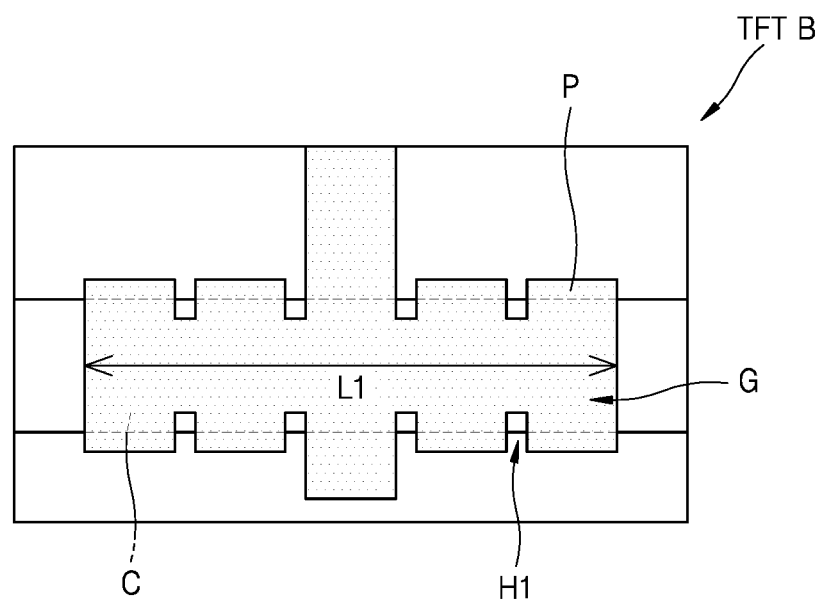
FIG. 7 illustrates an embodiment of a thin film transistor.

Referring to FIG. 7, a transistor TFTB is different from that of FIG. 6 in that the gate electrode G includes a plurality of first trenches H1. The plurality of first trenches H1 may be formed toward the inside of the gate electrode G from the outer side surface of the gate electrode G. The plurality of first trenches H1 may penetrate the gate electrode G in the thickness direction of the gate electrode G. In one or more embodiments, the gate electrode G includes a plurality of protrusions P protruding in a direction perpendicular to the length L1 of the channel region C.

Therefore, even when the length L1 of the channel region C increases, hydrogen may be effectively diffused into the entire channel region C during the heat treatment after the formation of the first insulation film 107 (e.g., see FIG. 1). Further, since the plurality of protrusions P among the plurality of first trenches H1 may extend to the outside of the channel region C in a direction perpendicular to the direction of the length L1 of the channel region C, it may be possible to prevent a change in characteristics of the thin film transistor TFTB from occurring, even when an error occurs in alignment between the gate electrode G and the channel region C during formation of the gate electrode G.

Figure 8:
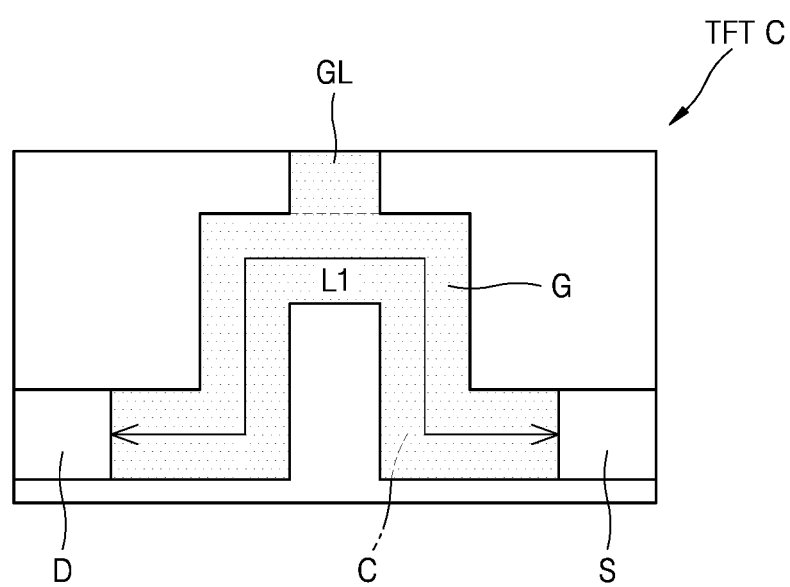
FIG. 8 illustrates an embodiment of a thin film transistor.

Referring to FIG. 8, the channel region C of the thin film transistor TFTC may include at least one bent portion. Also, the length L1 of the channel region C having the same shape as the gate electrode G may be greater than the length of a straight line connecting the drain region D and the source region S by the shortest distance. Therefore, the length L1 of the channel region C may be increased or maximized within a limited area. FIG. 8 illustrates a shape in which the channel region C is bent three times. The channel region C may have a different shape (e.g., "S", "M", "W," etc.) in other embodiments.

Figure 9:
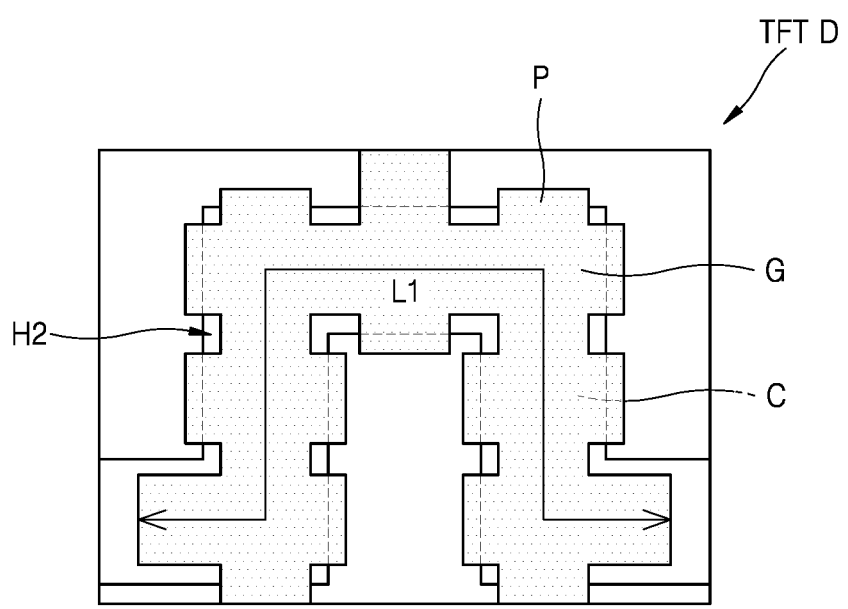
FIG. 9 illustrates an embodiment of a thin film transistor.

Referring to FIG. 9, a transistor TFTD is different from that of FIG. 8 in that the gate electrode G includes a plurality of second trenches H2. The plurality of second trenches H2 may be formed toward the inside of the gate electrode G from the outer side surface of the gate electrode G, and may penetrate the gate electrode G in the thickness direction of the gate electrode G. The gate electrode G may include a plurality of protrusions P protruding outward at positions among the plurality of second trenches H2. A plurality of second grooves H1 may expose a part of the channel region C. The protrusions P among the plurality of second trenches H2 may extend to the outside of the channel region C. Therefore, it may be possible to prevent a change in characteristics of the thin film transistor TFTD from occurring, even if an error occurs in the alignment between the gate electrode G and the channel region C during formation of the gate electrode G.

Figure 10:
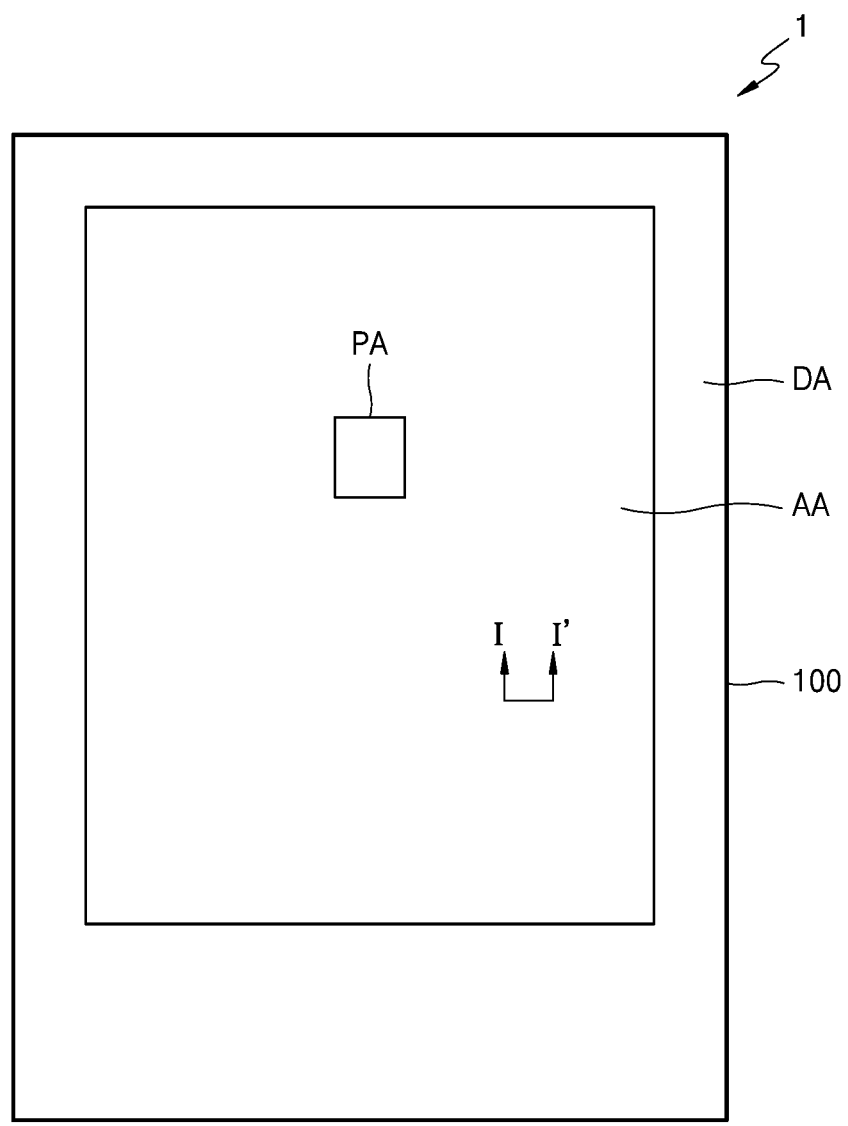
FIG. 10 illustrates an embodiment of a display device.
Figure 11:
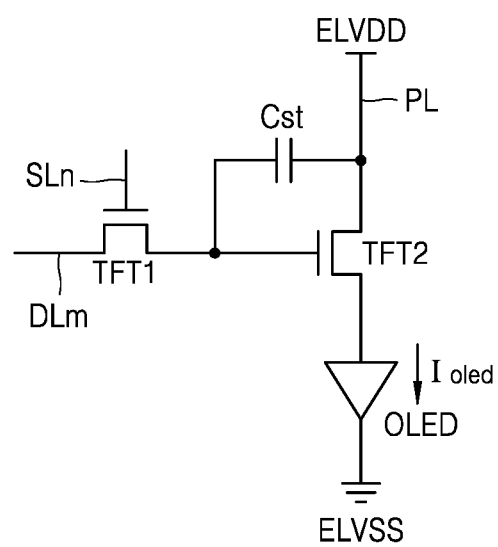
FIG. 11 illustrates an embodiment of a pixel.

FIG. 10 illustrates an embodiment of a display device, and FIG. 11 illustrates an equivalent circuit of a pixel which, for example, may be included in the display device of FIG. 10.

Referring to FIG. 10, an active area AA for displaying an image and a dead area DA adjacent to the active area AA are on the substrate 100 of the organic light-emitting display device 1. The active area AA includes pixel areas PA. A pixel for emitting predetermined light is formed for each of the pixel areas PA. An image is generated based on light emitted from the plurality of pixels in the active area AA.

The dead area DA may surround the active area AA and may include a driving unit for transmitting a predetermined signal to the pixels in the active area AA.

A protective substrate may be on the substrate 100 to protect the active area AA from external foreign matter. A sealing member may be between the substrate 100 and the protective substrate and may surround the active area AA. In one embodiment, a thin sealing film may be on the active area AA to protect the active area AA from external foreign matter.

Referring to 11, each pixel may include a display element to emit light with predetermined luminance by a switching thin film transistor TFT1, a driving thin film transistor TFT2, a storage capacitor Cst, and a driving current (Ioled). The display element may be an organic light-emitting diode OLED.

The switching thin film transistor TFT1 is connected to a scan line SLn and a data line DLm, and transmits a data signal input to the data line DLm based on a scan signal input to the scan line SLn to the driving thin film transistor TFT2.

The storage capacitor Cst is connected to the switching thin film transistor TFT1 and a first voltage line PL, and stores a voltage corresponding to a difference between a voltage from the switching thin film transistor TFT1 and a first power voltage ELVDD supplied to the first voltage line PL.

The driving thin film transistor TFT2 may be connected to the first voltage line PL and the storage capacitor Cst, and may control a driving current flowing from the first voltage line PL to the organic light-emitting diode OLED based on a voltage value stored in the storage capacitor Cst. The organic light-emitting diode OLED may emit light having predetermined luminance by the driving current. The pixel may have a different configuration (e.g., a different number of transistors and/or capacitors) in another embodiment.

The driving thin film transistor TFT2 may have a configuration which corresponds to one of the embodiments illustrated in FIGS. 6 to 9. Thus, the driving range of the gate voltage applied to the gate electrode of the driving thin film transistor TFT2 may be widened.

Figure 12:
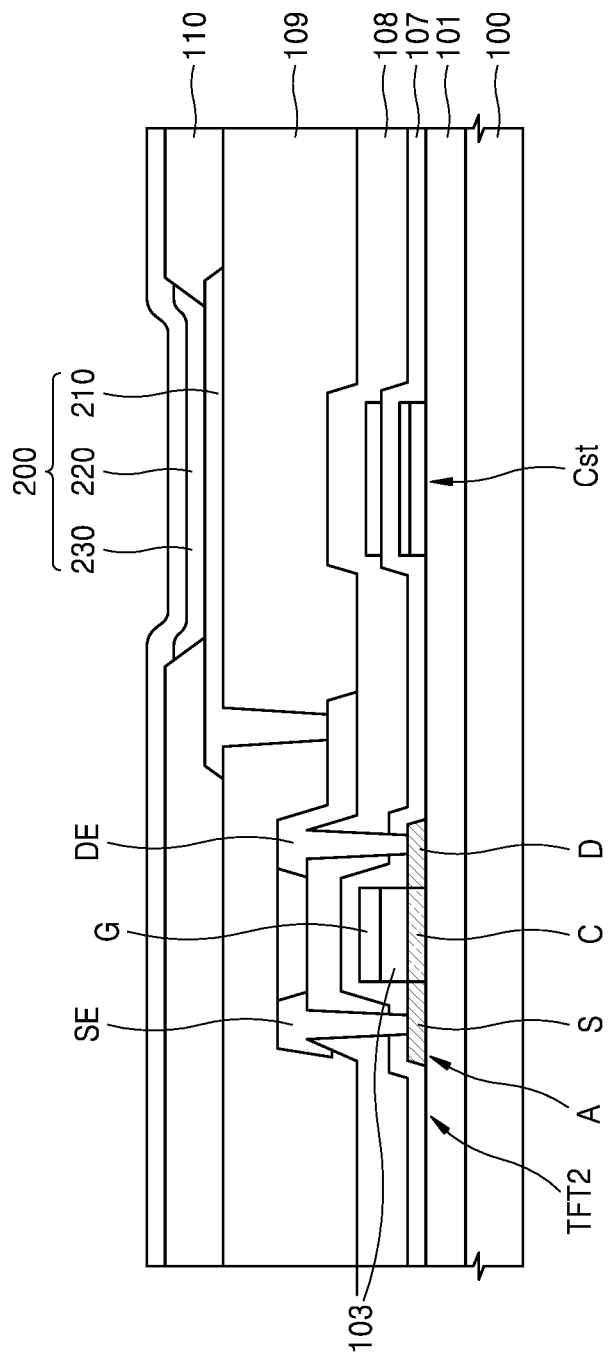
FIG. 12 illustrates a view taken along section line I-I' in FIG. 10.
Figure 13:
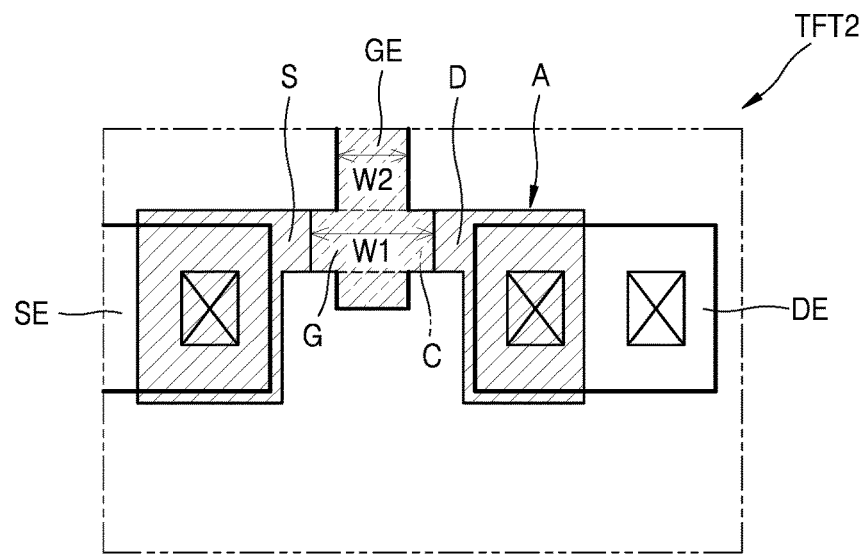
FIG. 13 illustrates an example of a thin film transistor.

FIGS. 12 and 13 illustrate one or more embodiments of the pixel area PA. In FIG. 12, for the convenience of explanation, in the pixel circuit of FIG. 11, the switching thin film transistor TFT1 is omitted, and the driving thin film transistor TFT2 is referred to as a thin film transistor TFT2.

The substrate 100 may include various materials. For example, the substrate 100 may include a transparent glass material (e.g., $SiO_2$) or a transparent plastic material. The plastic material may be, for example, polyether sulphone (PES), polyacrylate (PAR), polyether imide (PEI), polyethylene naphthalate (PEN), polyethyelene terephthalate (PET), polyphenylene sulfide (PPS), polyallylate, polyimide, polycarbonate (PC), cellulose triacetate (TAC), or cellulose acetate propionate (CAP).

In the case of a back emission-type display device in which an image is realized in the direction of the substrate 100, the substrate 100 includes a transparent material. However, in the case of a front emission-type display device in which an image is realized in a direction opposite to the substrate 100, the substrate 100 may or may not include a transparent material. In this case, in one embodiment, the substrate 100 may include a metal, e.g., iron, chromium, manganese, nickel, titanium, molybdenum, stainless steel (SUS), Invar alloy, Inconel alloy, or Kovar alloy.

A buffer layer 101 may be on the substrate 100, may provide a flat surface on the substrate 100, and may block foreign matter or moisture penetrating through the substrate 100. For example, the buffer layer 101 may include an inorganic material (e.g., silicon oxide, silicon nitride, silicon oxynitride, aluminum oxide, aluminum nitride, titanium oxide, or titanium nitride) or an organic material such as polyimide, polyester, or acrylate. The buffer layer 101 may be a laminate of a plurality of layers including the aforementioned materials.

A display element may be electrically connected with a thin film transistor TFT2 over the substrate 100. The thin film transistor TFT2 my include an active layer A, a gate electrode G over the active layer A, and a gate insulation film 103 between the active layer A and the gate electrode G. The active layer A may include an oxide semiconductor, e.g., indium (In), gallium (Ga), tin (Sn), zirconium (Zr), vanadium (V), hafnium (Hf) cadmium (Cd), germanium (Ge) chromium (Cr), titanium (Ti), and zinc (Zn). For example, the active layer A may be an IGZO (InGaZnO) semiconductor layer.

The active layer A may include a channel region C overlapping the gate electrode G, and a source region S and a drain region D on respective sides of the channel region G.

The gate insulation film 103 may include an organic material or an inorganic material such as SiNx or $SiO_2$.

The gate electrode G is on the gate insulation film 103 and may be connected with a gate line GE for applying on/off signals to the thin film transistor TFT2. The gate electrode G may include a single layer or a plurality of layers including, for example, at least one metal of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu).

The width W1 of the gate electrode G may be greater than the width W2 of the gate line GE. Thus, the trapping of electrons in the channel region C may be prevented even when the length of the channel region C increases. Thus, the driving range of a gate voltage increases. Thus, the gradation of the light emitted from a display element 200 may be more finely controlled by changing the magnitude of the gate voltage. Also, the resolution and display quality of the flat panel display device 1 (e.g., see FIG. 10) may be improved. For this purpose, the gate electrode G may have the shape described in FIGS. 6 to 9, and the shortest distance between any one point of the channel region C and the outer side surface of the gate electrode G may be 7 μm or less.

First and second insulation films 107 and 108 are formed on the gate electrode G. In this embodiment, the two interlayer insulation films (e.g., the first and second insulation films 107 and 108) may be on the gate electrode G. In one embodiment, the gate electrode G may be covered with a single interlayer insulation film.

A source electrode SE and a drain electrode DE may be electrically connected to the source region S and the drain region D, respectively, and may be on the second insulation layer 108. Each of the source electrode SE and the drain electrode DE may include a single layer or a plurality of layers including, for example, at least one metal of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu). For example, each of the source electrode SE and the drain electrode DE may have a three-layer laminate structure, for example, of titanium (Ti), aluminum (Al), and titanium (Ti).

A planarization layer 109 may be over the thin film transistor TFT2. The planarization layer 109 may eliminate a step caused by the thin film transistor TFT2 and may planarize the upper surface of the thin film transistor TFT2, thereby preventing the display element 200 from being defective due to the lower unevenness.

The planarization layer 109 may be a single layer or a multi-layer including an organic material. Examples of the organic material may include, for example, a general purpose polymer, e.g., polymethyl methacrylate (PMMA) and polystyrene (PS), polymer derivatives having a phenolic group, acrylic polymers, imide-based polymers, aryl ether polymers, amide-based polymers, fluorine-based polymers, p-xylene-based polymers, vinyl alcohol-based polymers, or blends thereof. Further, the planarization layer 109 may be a composite laminate of an inorganic insulation film and an organic insulation film.

The display element 200 is on the planarization layer 109. In one embodiment, the display element 200 may be an organic light-emitting element including a first electrode 210, a second electrode 230 facing the first electrode 210, and an intermediate layer 220 between the first electrode 210 and the second electrode 230.

The first electrode 210 may be on the planarization layer 109 and electrically connected to the thin film transistor TFT2. The first electrode 210 may be a reflective electrode. In one embodiment, the first electrode 210 may include a reflective film of, for example, Ag, Mg, Al, Pt, Pd, Au, Ni, Nd, Ir, Cr, or a compound thereof, and a transparent or translucent electrode layer on the reflective film. The transparent or translucent electrode layer may include at least one of indium tin oxide (ITO), indium zinc oxide (IZO), zinc oxide (ZnO), indium oxide ($In_2O_3$), indium gallium oxide indium gallium oxide, and aluminum zinc oxide (AZO).

The second electrode 230 may be a transparent or translucent electrode. In one embodiment, the second electrode 230 may include a metal thin film having a low work function and including Li, Ca, LiF/Ca, LiF/Al, Al, Ag, Mg, and a compound thereof. An auxiliary electrode layer or a bus electrode, which includes a material for forming a transparent electrode (e.g., ITO, IZO, ZnO, or $In_2O_3$) may be on the metal thin film. Accordingly, the second electrode 230 may transmit the light emitted from the organic light-emitting layer in the intermediate layer 220. For example, the light emitted from the organic light-emitting layer may be directly reflected or reflected by the first electrode 210 including the reflective electrode and may be emitted toward second electrode 230.

In some embodiments, the display device 1 (e.g., see FIG. 10) may be a front emission-type display device and a back emission-type display device in which the light emitted from the organic light-emitting layer is emitted toward the substrate 100. The first electrode 210 may be a transparent or translucent electrode. The second electrode 230 may be a reflective electrode. Further, the display device 1 (e.g., see FIG. 10) of this embodiment may be a dual side emission-type display device in which light is emitted in both front and back directions.

A pixel-defining layer 110 is on the first electrode 210 and may include an insulation material. For example, the pixel-defining layer 110 may include at least one organic insulation material, e.g., polyimide, polyamide, acrylic resin, benzocyclobutene, or phenol resin by a method such as spin coating. The pixel-defining layer 110 exposes a predetermined area of the first electrode 210, and the intermediate layer 220 including an organic light-emitting layer is in the exposed area. The pixel-defining layer 110 defines a pixel area of the organic light-emitting element.

The organic light-emitting layer in the intermediate layer 220 may include a low molecular weight organic material or a high molecular weight organic material. The intermediate layer 220 may further selectively include a functional layer such as a hole transport layer (HTL), a hole injection layer (HIL), an electron transport layer (ETL), or an electron injection layer (EIL) in addition to the organic light-emitting layer.

Figure 14:
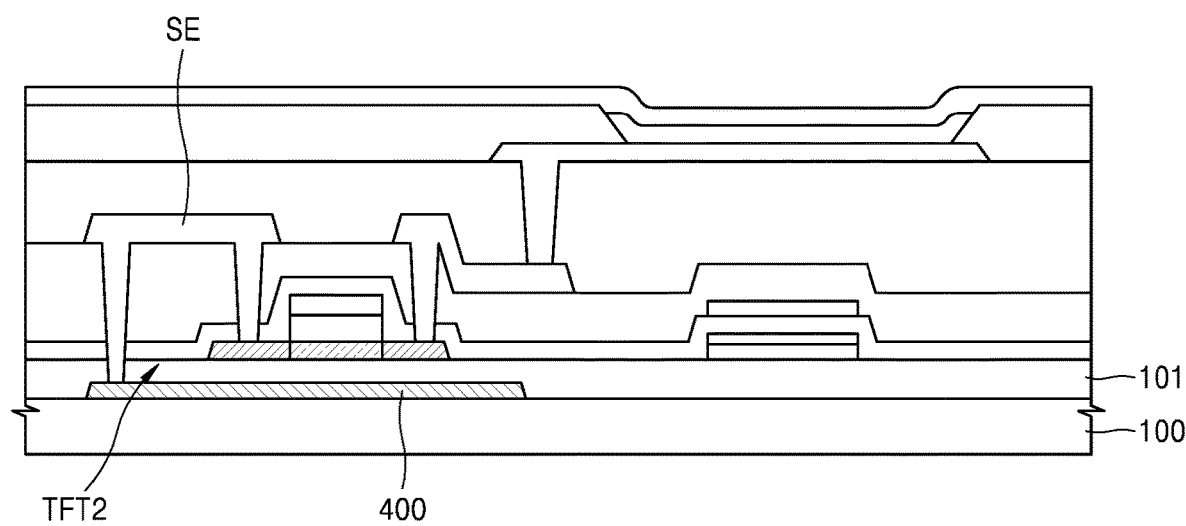
FIG. 14 illustrates a view taken along section line I-I' of FIG. 10 according to another embodiment.
Figure 15:
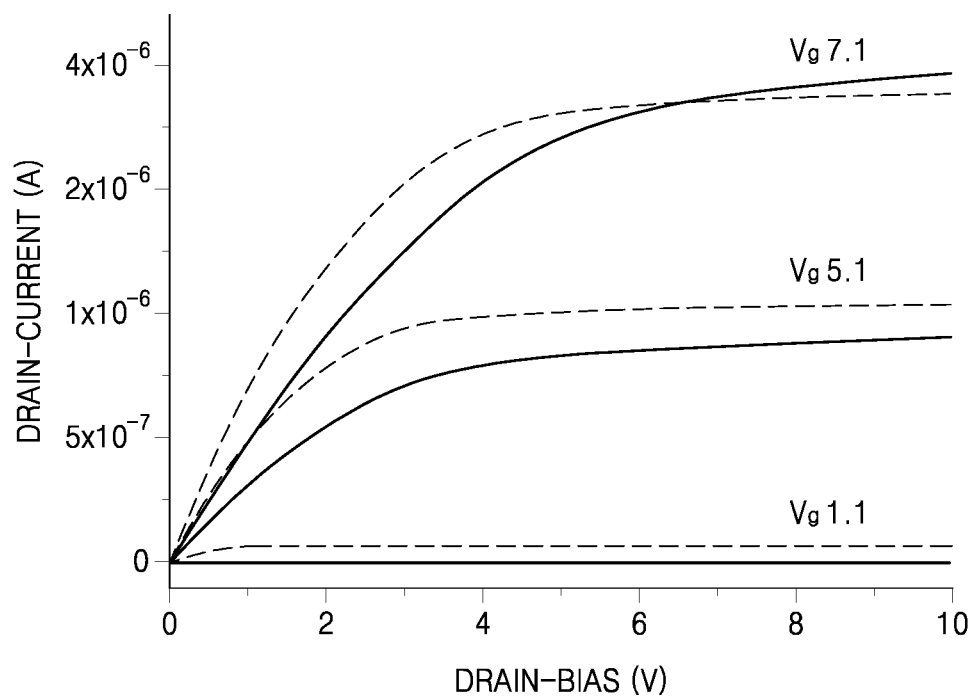
FIG. 15 illustrates another example of the characteristics of a thin film transistor.

FIG. 14 illustrates another embodiment taken along section line I-I' of FIG. 10. FIG. 15 is a graph illustrating an example of the changes in characteristics of a thin film transistor depending on the presence or absence of a blocking layer of FIG. 14. FIG. 14 illustrates only the difference from FIG. 12.

Referring to FIG. 14, the display device may further include a conductive layer 400 between the substrate 100 and the buffer layer 101. The conductive layer 400 overlaps the thin film transistor TFT2 and prevents light from entering the thin film transistor TFT2. Therefore, a photocurrent is in the oxide semiconductor of the thin film transistor TFT2 due to the incidence of light, thereby preventing the characteristics of the thin film transistor TFT2 from deteriorating.

Further, the conductive layer 400 is electrically connected to the source electrode SE of the thin film transistor TFT2, to further improve the characteristics of the thin film transistor TFT2.

In FIG. 15, the dashed line indicates a state in which the conductive layer 400 is electrically connected to the source electrode SE and the solid line indicates a state in which the conductive layer 400 is not formed. FIG. 15 shows example results of measuring drain current when Vgs of 1.1 V, 5.1 V, and 7.1 V are applied in the upward direction from the bottom of FIG. 15. As described above, it can be seen that it is easy to secure a stable saturation area when the conductive layer 400 and the source electrode SE are connected to each other.

According to one or more of the aforementioned embodiments, the length of the channel of a thin film transistor is increased. Thus, the driving range of the gate voltage applied to the gate electrode of the thin film transistor may be widened. Further, the width of the gate electrode is greater than the width of the gate line connected with the gate electrode. Thus, the change in threshold voltage Vth of the thin film transistor may be reduced or minimized even during repetitive sweeping.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A thin film transistor, comprising:
an active layer over a substrate and including an oxide semiconductor;
a gate electrode over the active layer and overlapping a channel region of the active layer, the channel region including at least one bent portion as seen in plan view;
a gate line electrically connected with the gate electrode;
a source electrode electrically connected with a source region of the active layer; and
a drain electrode electrically connected with a drain region of the active layer, wherein
a length of a straight line connecting a first contact part connecting the source region and the source electrode and a second contact part connecting the drain region and the drain electrode by a shortest distance is greater than a width of the gate line as seen in plan view, the width of the gate line being the smallest dimension of the gate line as seen in plan view, and
the width of the gate line is parallel to the straight line.

2. The thin film transistor as claimed in claim 1, further comprising:
a gate insulation layer between the active layer and the gate electrode; and
at least one insulation layer between the gate electrode and the source electrode and the gate electrode and the drain electrode.

3. The thin film transistor as claimed in claim 2, wherein the least one insulation layer directly contacts both the source region and the drain region, and
the least one insulation layer further directly contacts a side surface of the gate insulation layer between the gate electrode and the active layer.

4. The thin film transistor as claimed in claim 1, wherein the gate electrode and the gate line are integral with each other.

5. The thin film transistor as claimed in claim 1, wherein a shortest distance between any one point of the channel region and an outer side surface of the gate electrode is 7 μm or less.

6. The thin film transistor as claimed in claim 1, further comprising:
a conductive layer between the substrate and the active layer and overlapped with the active layer.

7. The thin film transistor as claimed in claim 6, wherein the conductive layer is electrically connected to the source electrode.

8. The thin film transistor as claimed in claim 1, wherein a length of the gate electrode is greater than the width of the gate line, the length of the gate electrode parallel to the width of the gate line.

9. The thin film transistor as claimed in claim 1, wherein the gate electrode does not cover at least a portion of the channel region.

10. The thin film transistor as claimed in claim 1, wherein the gate electrode overlaps the at least one bent portion of the active area in plan view.

11. The thin film transistor as claimed in claim 1, wherein the source region, the channel region and the drain region of the active layer are continuous.

12. The thin film transistor as claimed in claim 1, wherein
the source region of the active layer is directly connected to a first end of the channel region;
the drain region of the active layer is directly connected to a second end of the channel region, wherein
the source electrode is directly connected with the source region of the active layer at the first contact part; and
a drain electrode electrically is directly connected with the drain region of the active layer at the second contact part.

13. A display device, comprising:
a substrate; and
a thin film transistor on the substrate, wherein
the thin film transistor comprises:
an active layer including an oxide semiconductor;
a gate electrode over the active layer and overlapping a channel region of the active layer, the channel region including at least one bent portion as seen in plan view;
a gate insulation film between the active layer and the gate electrode;
a gate line electrically connected with the gate electrode;
a source electrode electrically connected with a source region of the active layer; and
a drain electrode electrically connected with a drain region of the active layer,
a length of a straight line connecting one end of the gate insulation film adjacent to the drain region and another end of the gate insulation film adjacent to the source region by a shortest distance is greater than a width of the gate line,
the width of the gate line is parallel to the straight line,
the width of the gate line is the smallest dimension of the gate line as seen in plan view.

14. The display device as claimed in claim 13, further comprising:
a buffer layer between the substrate and the active layer; and
at least one insulation layer between the gate electrode and the source electrode and the gate electrode and the drain electrode.

15. The display device as claimed in claim 14, further comprising:
a conductive layer between the substrate and the buffer layer and overlapped with the active layer.

16. The display device as claimed in claim 15, wherein the conductive layer is electrically connected to the source electrode.

17. The display device as claimed in claim 13, wherein the gate electrode and the gate line are integral with each other.

18. The display device as claimed in claim 13, wherein a length of the gate electrode is greater than the width of the gate line, the length of the gate electrode parallel to the width of the gate line.

19. The display device as claimed in claim 13, wherein a shortest distance between any one point of the channel region and an outer side surface of the gate electrode is 7 μm or less.

20. The display device as claimed in claim 13, further comprising:
a display element electrically connected with the thin film transistor.

21. The thin film transistor as claimed in claim 13, wherein the source region, the channel region and the drain region of the active layer are continuous.

22. The display device as claimed in claim 13, wherein
the source region of the active layer is directly connected to a first end of the channel region,
the drain region of the active layer is directly connected to a second end of the channel region,
the gate insulation film is directly between the active layer and the gate electrode;
a gate line electrically connected with the gate electrode;
the source electrode is directly connected with the source region of the active layer,
the drain electrode is directly connected with the drain region of the active layer,
the length of a straight line connecting one end of the gate insulation film directly over a location where the channel region directly contacts the drain region and another end of the gate insulation film directly over a location where the channel region directly contacts the source region by a shortest distance is greater than a width of the gate line, and
the gate line extends in a direction parallel to the straight line.

* * * * *